(12) United States Patent
Suzuki et al.

(10) Patent No.: US 9,166,499 B2
(45) Date of Patent: Oct. 20, 2015

(54) ELECTRONIC CIRCUIT OPERATING BASED ON ISOLATED SWITCHING POWER SOURCE

(71) Applicant: DENSO CORPORATION, Kariya, Aichi-pref. (JP)

(72) Inventors: Tomotaka Suzuki, Nagoya (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 140 days.

(21) Appl. No.: 14/043,087

(22) Filed: Oct. 1, 2013

(65) Prior Publication Data

US 2014/0092653 A1   Apr. 3, 2014

(30) Foreign Application Priority Data

Oct. 1, 2012   (JP) ................. 2012-219755

(51) Int. Cl.
| | |
|---|---|
| *H02M 7/537* | (2006.01) |
| *H02M 1/08* | (2006.01) |
| *H02M 7/538* | (2007.01) |
| *H03K 17/691* | (2006.01) |
| *H03K 17/795* | (2006.01) |

(Continued)

(52) U.S. Cl.
CPC ............. *H02M 7/537* (2013.01); *H02M 1/08* (2013.01); *H02M 7/538* (2013.01); *H03K 17/691* (2013.01); *H03K 17/7955* (2013.01); *H02M 3/33507* (2013.01); *H02M 7/003* (2013.01); *H03K 2217/0081* (2013.01)

(58) Field of Classification Search
CPC .......... H02M 2001/0006; H02M 1/08; H02M 1/084; H02M 1/088; H02M 1/096; H02M 1/092
See application file for complete search history.

(56) References Cited

U.S. PATENT DOCUMENTS

2012/0025875 A1* 2/2012 Fukuta et al. ................. 327/109

FOREIGN PATENT DOCUMENTS

| JP | 2007-220562 | 8/2007 |
|---|---|---|
| JP | 2011-130571 | 6/2011 |
| JP | 2011-244619 | 12/2011 |

OTHER PUBLICATIONS

"Machine translation of Japanese publication JP-2011-130571. Obtained from [https://www4.j-platpat.inpit.go.jp/eng/tokujitsu/tkbs_en/TKBS_EN_GM301_Detailed.action] on Apr. 8, 2015.".*

(Continued)

*Primary Examiner* — Fred E Finch, III
*Assistant Examiner* — Rafael O De Leon Domenech
(74) *Attorney, Agent, or Firm* — Nixon & Vanderhye PC

(57) ABSTRACT

In an electronic circuit, a first circuit region is electrically connected to an input circuit region of an isolated switching power source, and a second circuit region is electrically connected to an output circuit region thereof. A driver of an IC is located in the second circuit region and drives a target device based on output power supplied to the second circuit region via the output circuit region from the isolated switching power source. A transferring module of the IC transfers a value of a parameter indicative of the output power from the second circuit region to the first circuit region while maintaining electrical isolation between the first and second circuit regions. An operating module of the IC performs on-off operations of a switching element to perform feedback control of the value of the parameter indicative of the output power to a target value.

12 Claims, 8 Drawing Sheets

(51) Int. Cl.
*H02M 3/335* (2006.01)
*H02M 7/00* (2006.01)

(56) References Cited

OTHER PUBLICATIONS

ACPL-330J, "1.5 Amp Output Current IGBT Gate Driver Optocoupler with Integrated ($V_{CE}$) Desaturation Detection, UVLO, Fault Feedback, Active Miller Clamp and Auto Fault Reset", Avago Technologies, Oct. 2012, 22 pages.

Office Action (2 pgs.) dated Sep. 9, 2014 issue in corresponding Japanese Application No. 2012-219755 with an at least partial English-language translation thereof (2 pgs.).

* cited by examiner

ELECTRONIC CIRCUIT OPERATING BASED ON ISOLATED SWITCHING POWER SOURCE

CROSS REFERENCE TO RELATED APPLICATIONS

This application is based on and claims the benefit of priority from Japanese Patent Application 2012-219755 filed on Oct. 1, 2012, the disclosure of which is incorporated in its entirety herein by reference.

TECHNICAL FIELD

The present disclosure relates to electronic circuits operating based on an isolated switching power source.

BACKGROUND

There are known isolated switching power sources, an example of which is disclosed in Japanese Patent Application Publication No. 2011-244619. An isolated switching power source disclosed in the Patent Publication is comprised of a transformer that partitions the circuit region of the isolated switching power source into an input circuit region in which a power source lies and an output circuit region while the input circuit region is electrically isolated from the output circuit region. The isolated switching power source is designed to transfer power output from the power source to the output circuit region. Specifically, in addition to the transformer, the isolated switching power source is comprised of a control circuit designed specifically therefor. The control circuit performs feedback control of an output value, such as an output current value from the isolated switching power source, which adjusts the output value to a target value.

SUMMARY

The inventors of this application have tried to adopt such an isolated switching power source as the power supply of an integrated circuit (IC) for driving predetermined target devices. As described above, such an isolated switching power source requires a control circuit designed specifically therefor for controlling an output value therefrom. For this reason, an electronic circuit, which includes an IC and such an isolated switching power source serving as the power supply of the IC, is further equipped with a control circuit located out of the IC and designed specifically for the isolated switching power source. This may result in an increase of the size of the electronic circuit.

In view of the circumstances set forth above, one aspect of the present disclosure seeks to provide electronic circuits each equipped with an IC for driving a predetermined target device based on power supplied from an isolated switching power source; the electronic circuits are designed to address the problem set forth above.

Specifically, an alternative aspect of the present disclosure aims to provide such electronic circuits, each of which has a smaller size.

According to an exemplary aspect of the present disclosure, there is provided an electronic circuit operating based on an isolated switching power source. The isolated switching power source partitions a circuit region thereof into an input circuit region in which a power source lies and an output circuit region. The input circuit region is electrically isolated from the output circuit region. The isolated switching power source outputs, via a switching element, power supplied from the power source to the output circuit region. The electronic circuit includes a first circuit region electrically connected to the input circuit region, a second circuit region electrically connected to the output circuit region, and an integrated circuit. The integrated circuit includes a driver located in the second circuit region and configured to drive a target device based on the output power supplied to the second circuit region via the output circuit region. The integrated circuit includes a transferring module configured to transfer first information including a value of a parameter indicative of the output power from the second circuit region to the first circuit region while maintaining electrical isolation between the first and second circuit regions. The integrated circuit includes an operating module configured to perform, based on the first information transferred by the transferring module, on-off operations of the switching element to perform feedback control of the value of the parameter indicative of the output power supplied to the second circuit region via the output circuit region to a target value.

In the electronic circuit according to the exemplary aspect of the present disclosure, the electronic circuit includes the first circuit region electrically connected to the input circuit region of the isolated switching power source, and the second circuit region electrically connected to the output circuit region of the isolated switching power source. As components of the integrated circuit, in addition to the driver located in the second circuit region and configured to drive the target device based on the output power supplied to the second circuit region via the output circuit region, the operating module is provided. The operating module is configured to perform, based on the first information transferred by the transforming module, on-off operations of the switching element to perform feedback control of the value of the parameter indicative of the output power supplied to the second circuit region via the output circuit region to a target value.

Thus, in comparison to a configuration that the operating module is located externally to the integrated circuit, the configuration of the electronic circuit according to the exemplary aspect of the present disclosure results in reduction of the electronic circuit in size.

The above and/or other features, and/or advantages of various aspects of the present disclosure will be further appreciated in view of the following description in conjunction with the accompanying drawings. Various aspects of the present disclosure can include or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
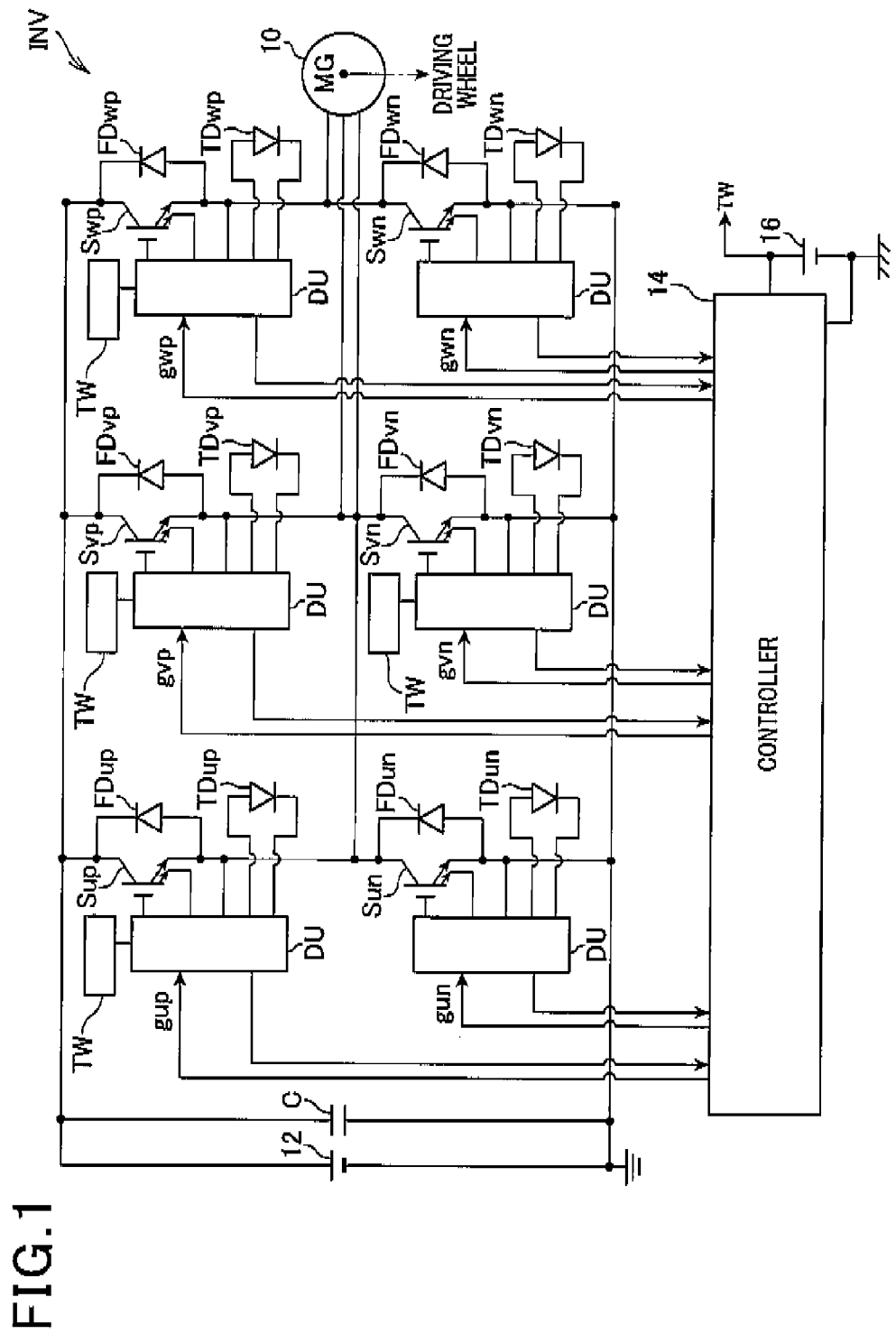
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified to avoid redundant description.

First Embodiment

Referring to FIG. 1, there is illustrated a three-phase motor-generator as an example of rotating machines, referred to simply as a "motor-generator" 10, installed in a motor vehicle, such as a hybrid vehicle or an electric vehicle, as a main engine according to the first embodiment. In addition, there is illustrated an inverter INV connected to the motor-generator 10; an electronic circuit according to the first embodiment of the present invention is installed in the inverter INV. The motor-generator 10 is mechanically coupled to driving wheels (not shown) of the motor vehicle.

For example, as the motor-generator 10, a brushless DC motor, i.e. a three-phase SM (Synchronous Motor), is used.

The motor-generator 10 includes, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with the inverter INV, a high-voltage battery 12, a smoothing capacitor C, drive units DU, temperature-sensitive diodes TD*# (*=u, v, w, #=p, n), transformers TW, a controller 14, and a low-voltage battery 16.

To the motor-generator 10, the high-voltage battery 12 is electrically connected via the smoothing capacitor C and the inverter INV. The high-voltage battery 12 has a terminal voltage thereacross, which is, for example, equal to or higher than 100 V. In the first embodiment, the high-voltage battery 12 has a terminal voltage of 288 V thereacross. The smoothing capacitor C is operative to smooth the terminal voltage across the high-voltage battery 12.

The inverter INV is designed as a three-phase inverter. The inverter INV is provided with three pairs of series-connected high- and low-side (upper- and lower-arm) switching elements Sup and Sun, Svp and Svn, and Swp and Swn. The inverter INV is also provided with flywheel diodes FD*# (*=u, v, w, #=p, n) electrically connected in antiparallel to the corresponding switching elements S*# (*=u, v, w, #=p, n), respectively.

In the first embodiment, as the switching elements S*# (*=u, v, w, #=p, n), IGBTs are respectively used.

When power MOSFETs are used as the switching elements S*# (*=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S*p (*=u, v, w) is connected to a corresponding one of the elements S*n (*=u, v, w) in series is connected to an output lead extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line.

The temperature-sensitive diodes TD*# are located to be close to the respective switching elements S*#, and operative to measure the temperatures of the respective switching elements S*#.

For example, the controller 14 operates on a power-supply voltage, sufficiently lower than the terminal voltage across the high-voltage battery 12, supplied from the low-voltage battery 16.

To the controller 14, a request-torque input unit TI is connected; the request-torque input unit TI is operative to input, to the controller 14, a request torque to be output from the motor-generator 10 according to, for example, driver's operation of an accelerator operating member, i.e. accelerator pedal, installed in the motor vehicle.

The controller 14 is designed to drive the inverter INV to thereby control controlled variables of the motor-generator 10 based on the request torque. In the first embodiment, the controller 14 is designed to drive the inverter INV to thereby adjust a value of the output torque of the motor-generator 10 to the request torque.

Specifically, the controller 14 is designed to perform a known triangular PWM (Pulse-Width Modulation) task to produce drive signals g*# for the respective switching elements S*#. Then, the controller 14 is designed to send the drive signals g*# to the drive units DU provided for the respective switching elements S*#, thus individually turning on or off the respective switching elements S*#. The individual turn-on or off of the respective switching elements S*# convert the output DC voltage smoothed by the smoothing capacitor C into an AC voltage, and supply the AC voltage to the motor-generator 10.

For example, each of the drive signals g*# has a controllable duty cycle, i.e. a predetermined ratio of on duration to the total duration of each switching cycle for a corresponding one of the switching elements S*#. The duty cycle of each of the drive signals g*# is determined to adjust a value of the output torque of the motor-generator 10 to the request torque. The drive signals g*p and g*n for each leg (phase) complementarily change between an on state and an off state.

Specifically, the controller 14 is designed to complementarily turn on the high- and low-side switching elements S*# for each leg (phase) via the corresponding drive units DU*# according to the corresponding drive signals g*#. In other words, the controller 14 is designed to alternately turn on the high-side switching element S*p of one leg (phase) and the low-side switching element S*n of the same leg (phase).

Figure 2:
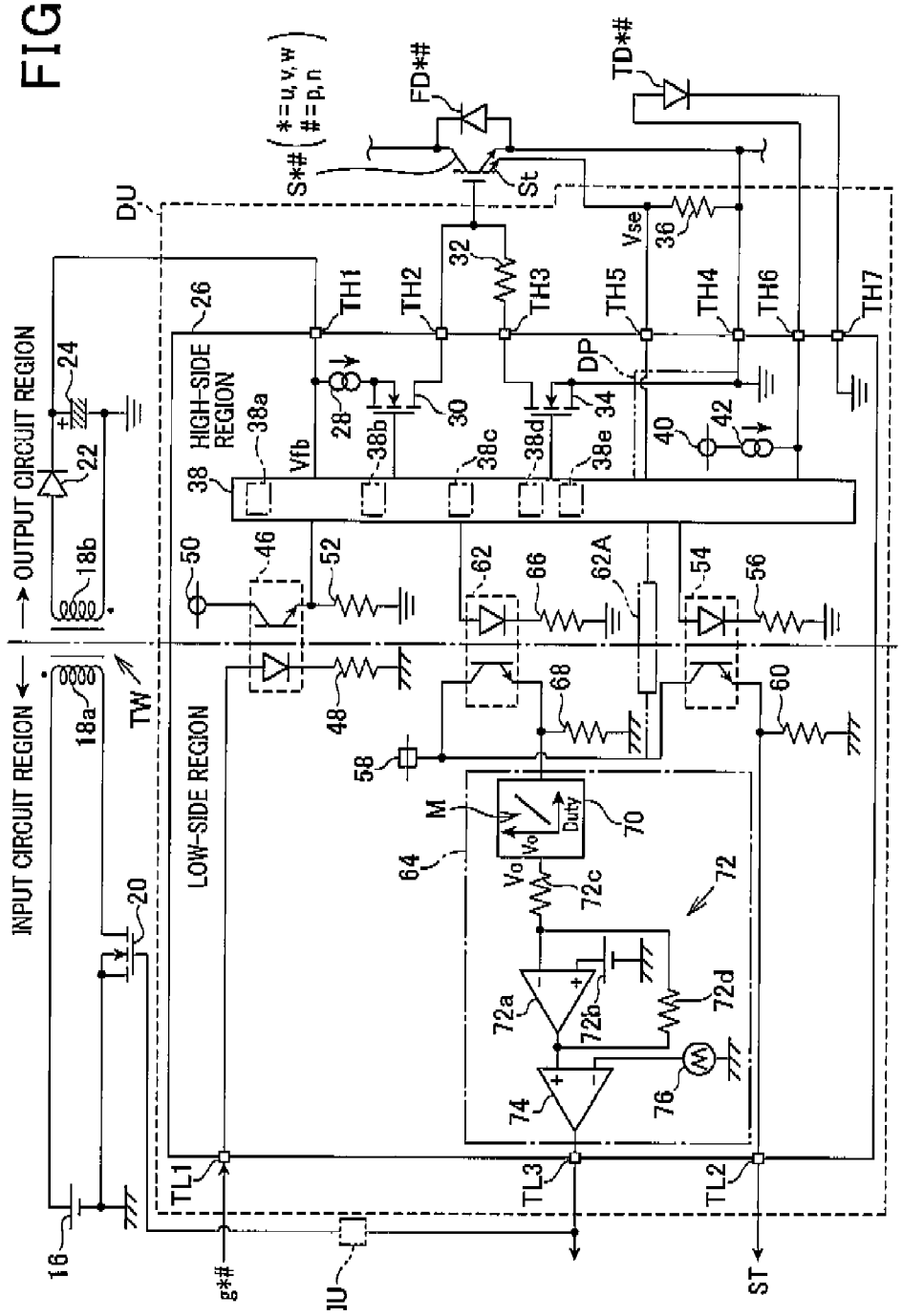
FIG. 2 is a circuit diagram schematically illustrating an example of the structures of a drive unit for a switching element and an isolated switching power source of the control system illustrated in FIG. 1.

To the drive units DU provided for the respective switching elements S*#, an isolated switching power source PS comprised of the transformers TW and the low-voltage battery 16 supplies power (see FIG. 2). In the first embodiment, for the drive units DU of the respective U-, V-, and W-phase upper-arm switching elements S*p, the transformers TW are provided to supply power from the low-voltage battery 16 to the respective drive units DU of the respective U-, V-, and W-phase upper-arm switching elements S*p via the corresponding transformers TW. In contrast, for only the drive unit DU of the V-phase lower-arm switching element Svn, the transformer TW is provided to supply power from the low-voltage battery 16 to the drive units DU of the respective U-, V-, and W-phase lower-arm switching elements S*n via the transformer TW. A specific structure indicative of how to supply power to the switching elements S*# from the low-voltage battery 16 via the transformers TW will be fully described later with reference to FIG. 6.

Next, an example of the circuit structure of the isolated switching power source PS and that of each drive unit DU provided for a corresponding one switching element S*# will be described with reference to FIG. 2.

Referring to FIG. 2, the isolated switching power source PS is designed as a flyback switching power source comprised of the transformer TW, a voltage-control switching element 20, a diode 22, and a capacitor 24. As the voltage-control switching element 20, an N-channel MOSFET is for example used.

The transformer TW is configured to partition a circuit region thereof into an input circuit region in which the low-voltage battery 16 lies and an output circuit region, so that the input circuit region is electrically isolated from the output circuit region.

The transformer TW is comprised of a pair of insulated primary winding 18a and secondary winding 18b. Both terminals of the low-voltage battery 16 are connected to each other via the primary winding 18a and the voltage-control switching element 20. Specifically, the positive terminal of the low-voltage battery 16 is connected to one end of the primary winding 18a, and the other end of the primary winding 18a is connected to the drain of the voltage-control switching element 20. The source of the voltage-control switching element 20 is connected to the negative terminal of the low-voltage battery 16. The gate of the voltage-control switching element 20 is connected to the drive unit DU.

Both ends of the secondary coil 18b are connected to each other via series-connected diode 22 and capacitor 24. Specifically, one end of the secondary winding 18b is connected to the anode of the diode 22, and the cathode thereof is connected to one electrode of the capacitor 24. The other electrode of the capacitor 24 is connected to the other end of the secondary winding 18b. The connection point between the other end of the secondary winding 18b and the other electrode of the capacitor 24 is grounded. The connection point between the cathode of the diode 22 and the one electrode of the capacitor 24 is connected to a first high-side terminal TH1 of a drive integrated circuit (IC) 26 installed in the drive unit DU described later. As the capacitor 24, an electrolytic capacitor is for example used.

The drive unit DU is comprised of the drive IC 26, a discharging resistor 32, and a sense resistor 36.

The drive IC 26 has the first high-side terminal TH1, second to seventh high-side terminals TH2 to TH7, and first to third low-side terminals TL1 to TL3. The drive IC 26 also has a constant current source 28, a charging switching element 30, a discharge switching element 34, a high-side controller 38, a constant voltage source 40, and a constant current source 42. The drive IC 26 further has a first photocoupler 46, a resistor 48, a constant voltage source 50, a resistor 52, a second photocoupler 54, a resistor 56, a constant voltage source 58, a resistor 60, a third photocoupler 62, a PWM controller 64, a resistor 66, and a resistor 68. As the charging switching element 30, a P-channel MOSFET is used, and as the discharging switching element 34, an N-channel MOSFET is used.

The first high-side terminal TH1 is connected to the second high-side terminal TH2 via the constant current source 28 and the charging switching element 30. The second high-side switching element TH2 is connected to the gate, i.e. control terminal, of the switching element S*#. The gate of the switching element S*# is also connected to the third high-side terminal TH3 via the discharging resistor 32, and the third high-side terminal TH3 is connected to a high-side common ground line via the discharging switching element 34. An output terminal, i.e. the emitter, of the switching element S*# is connected to the high-side common ground line via the fourth high-side terminal TH4.

The switching element S*# has a sense terminal St for outputting a minute current, referred to as a sense current, associated with a current, such as a collector current Ic, flowing through the conductive path between the collector, i.e. an input terminal, and emitter, i.e. the output terminal, thereof. The sense terminal St is connected to the high-side common ground line via the sense resistor 36 and the fourth high-side terminal TH4 and to the emitter of the switching element S*#.

When the collector current Ic flows through the conductive path of the switching element S*#, a sense current associated with the collector current Ic flows through the sense resistor 36, causing a voltage drop across the sense resistor 36. Thus, the potential at one end of the sense resistor 36 connected to the sense terminal St, which will be referred to as a sense voltage Vse, shows an electrical state level correlated with the level of the collector current Ic. The sense voltage Vse is input to the high-side controller 38 via the fifth high-side terminal TH5. Note that, in the first embodiment, if the potential at the one end of the resistor 36 connected to the sense terminal St is higher than that at the other end of the resistor 36, the polarity of the sense voltage Vse is defined as positive polarity.

The anode of the temperature-sensitive diode TD*# is connected to the sixth high-side switching element TH6, and the sixth high-side switching element TH6 is connected to the high-side controller 38 and to the constant voltage source 40 via the constant current source 42. This configuration causes a constant voltage based on the constant voltage source 40 is applied to the anode of the temperature-sensitive diode TD*# via the sixth high-side switching element TH6 and the constant current source 42. The cathode of the temperature-sensitive diode TD*# is connected to, for example, the high-side common ground line via the seventh high-side terminal TH7.

Because the temperature-sensitive diode TD*# is sensitive to temperature therearound, a forward voltage across the temperature-sensitive diode TD*# while the constant current continuously flows therethrough varies depending on the variation in the temperature of the switching element S*#. The forward voltage of the temperature-sensitive diode TD*#, i.e. a voltage at the sixth high-side terminal TH6, is input to the high-side controller 38 via the sixth high-side terminal TH6. Note that, as the temperature of the temperature-sensitive diode TD*# increases, the forward voltage of the temperature-sensitive diode TD*# decreases. In other words, the forward voltage of the temperature-sensitive diode TD*# has a negative correlation with the temperature of the switching element S*#.

Next, various tasks executed by the high-side controller 38 of each drive unit DU will be described hereinafter. Note that the high-side controller 38 of each drive unit DU can be configured as a programmed logic unit, a hard-wired logic unit, or the combination of hardwired-logic and programmed-logic hybrid units.

First, let us describe a drive task of the switching element S*#.

The high-side controller 38 serving as a driver 38a alternately turns on the charging switching element 30 and the discharging switching element 34. Specifically, the high-side controller 38 turns on the charging switching element 30 while keeping off the discharging switching element 34 if the drive signal g*# having a predetermined logical level, i.e. a logical high level, defined as an on command is input thereto. This charges the gate of the switching element S*# based on a charge current supplied to the gate of the switching element SŸ# from the constant current source 28 to through the charging switching element 30 and the second high-side switching element TH2, thus turning on the switching element S*#.

On the other hand, the high-side controller 38 turns on the discharging switching element 34 while keeping off the charging switching element 30 if the drive signal g*# having a predetermined logical, level defined as an off command is input thereto. This discharges the gate of the switching element S*# through the electrical path between the gate thereof and the high-side common ground line through the discharging resistor 32 and the discharging switching element 34, thus turning off the switching element S*#.

Next, let us describe an overcurrent protection task hereinafter.

The high-side controller 38 serving as an abnormality determining module 38b determines whether the sense voltage Vse at the fifth high-side terminal Th5 is equal to or higher than a threshold level. If it is determined that the sense voltage Vse at the fifth high-side terminal Th5 is equal to or higher than the threshold level, the high-side controller 38 determines that an overcurrent is flowing through the switching element S*#. Then, the high-side controller 38 serving as a disabling module 38c forcibly turns off the switching element S*# independently of the logical level of the drive signal g*#, i.e. independently of whether the drive signal g*# is the on command or off command. For example, the high-side controller 38 turns on a switching element provided on a discharging path, which illustrated by a phantom line in FIG. 2 to connect the gate of the switching element S*# to the common potential line via the discharging path, thus discharging the gate of the switching element S*#. Note that the resistance of the discharging path used by the overcurrent protection task is preferably higher than that of the normal discharging path between the gate of the switching element S*# and the common potential line via the discharging switching element 34 and the discharging resistor 32. This reduces the rate of change of the switching element S*# from the on state to the off state, thus preventing a surge from excessively rising.

In addition, let us describe a temperature output task and a local shutdown task hereinafter.

The high-side controller 38 is operative to perform a temperature output task. The high-side controller 38 serving as the abnormality determining module 38b and the disabling module 38c performs the local-shutdown task.

Specifically, the temperature output task, which functions as an information outputting module 38d, converts the forward voltage of the temperature-sensitive diode TD*# into a first Duty signal referred to also as a temperature signal ST. The first Duty signal is a pulse signal having a controllable duty cycle, i.e. a predetermined ratio or percentage of a logical high duration to the total logical high and low duration for each cycle.

In addition, the local shutdown task, which functions as the abnormality determining module 38b, determines that there is a high possibility of the switching element S*# becoming in an overheating condition if the forward voltage of the temperature-sensitive diode TD*# is lower than a prescribed voltage, i.e. the temperature of the switching element S*# is higher than a prescribed temperature. Then, the local shutdown task, which functions as the disabling module 38c, disables drive, i.e. turn-on, of the switching element S*#. The local shutdown task makes it possible to prevent the switching element S*# from becoming in the overheating condition, thus prohibiting the reliability of the switching element S*# from being reduced due to the overheating thereof.

Note that the control system 100 is configured such that the drive signal g*# output from the controller 14 is input to the high-side controller 38 via the first high-side terminal TH1 and the first photocoupler 46. Why the control system 100 employs the configuration is that a low-voltage region, in which the controller 14 and the low-voltage battery 16 lie, and a high-voltage region, in which the high-voltage battery 12 lies, of the transformer TW are electrically isolated from each other. For this reason, the drive IC 26 according to the first embodiment is equipped with a low-side region corresponding to the input circuit region of the transformer TW and a high-side region corresponding to the output circuit region of the transformer TW. The first photocoupler 46, serving as an insulating transfer element constituting insulating communication means, is used to transfer the drive signal g*# from the low-side region to the high-side region while electrically insulating between the low- and high-side regions. The first photocoupler 46 is comprised of a photodiode as its primary side and a phototransistor as its secondary side. The anode of the photodiode of the first photocoupler 46 is connected to the first low-side terminal TL1, and the first low-side terminal TL1 is connected to the controller 14, so that the drive signal g*# is input to the drive IC 26 via the first low-side terminal TL1. The cathode of the photodiode of the first photocoupler 46 is connected to one end of the resistor 48, and the other end of the resistor 48 is connected to a low-side common ground line. The collector of the phototransistor of the first photocoupler 46 is connected to the constant voltage source 50 having a predetermined terminal voltage of for example, 5 V. The emitter of the phototransistor is connected to one end of the resistor 52, and the other end of the resistor 52 is connected to, for example, the high-side common ground line. The connection point between the emitter of the phototransistor and the one end of the resistor 52 is connected to the high-side controller 38.

This configuration of the first photocoupler 46 and its peripherals 48, 50, and 52 makes it possible to convert the logical high level of the drive signal g*# into the terminal voltage of the constant voltage source 50. That is, the configuration outputs the terminal voltage of the constant voltage source 50 as the logical high level of the drive signal g*#. This configuration of the first photocoupler 46 and its peripherals 48, 50, and 52 also makes it possible to convert the logical low level of the drive signal g*# into a high-side ground potential at the high-side common ground line through the resistor 52. That is, the configuration outputs the high-side ground potential as the logical low level of the drive signal g*#.

Note that the high-side ground potential in the high-side region is set to be different from a low-side ground potential in the low-side region as an example. Specifically, in the first embodiment, the median value between the potential at the positive terminal and that at the negative terminal of the high-side battery 12 lying in the high-side region is set to the low-side ground potential in the low-side region. For example, between the positive and negative terminals of the high-voltage battery 12, a pair of series-connected capacitors or a pair of series-connected resistors are connected, and the connection point between the capacitors or the resistors is connected to the negative terminal of the low-voltage battery 16. This makes it possible to produce the difference in ground potential between the high-side region and the low-side region.

Next, how the drive IC is configured to transfer signals from the high-side region to the low-side region in the drive IC 26 will be described hereinafter.

The high-side controller 38 serving as the information outputting module 38d transfers the first Duty signal generated by the temperature output task to the controller 14 via the second photocoupler 54 and the second low-side terminal TL2.

Specifically, the second photocoupler 54 is comprised of a photodiode as its primary side and a phototransistor as its secondary side. The anode of the photodiode of the second photocoupler 54 is connected to the high-side controller 38, the cathode of the photodiode of the second photocoupler 54 is connected to one end of the resistor 56, and the other end of the resistor 56 is connected to the high-side common ground line. The collector of the phototransistor of the second photocoupler 54 is connected to the constant voltage source 58 having a predetermined terminal voltage of, for example, 5 V. The emitter of the phototransistor is connected to one end of the resistor 60, and the other end of the resistor 60 is connected to the low-side common ground line. The connection point between the emitter of the phototransistor and the one end of the resistor 60 is connected to the controller 14 via the second low-side terminal TL2.

This configuration of the second photocoupler 54 and its peripherals 56, 58, and 60 makes it possible to convert the first Duty signal, i.e. the temperature signal ST, into the terminal voltage of the constant voltage source 58. That is, the configuration outputs the terminal voltage of the constant voltage source 58 as the logical high level of the first Duty signal ST. This configuration of the second photocoupler 54 and its peripherals 56, 58, and 60 also makes it possible to convert the logical low level of the first Duty signal ST into the low-side ground potential at the common low-side ground line through the resistor 60. That is, the configuration outputs the low-side ground potential as the logical low level of the first Duty signal ST.

In the first embodiment, when receiving the first Duty signal (temperature signal) ST, the controller 14 is configured to calculate the temperature of the switching element S*# as a function of the first Duty signal (temperature signal) ST. Then, the controller 14 is configured to determine whether the calculated temperature is higher than a threshold temperature set to be lower than the prescribed temperature used by the local shutdown task. Upon determination that the calculated temperature is higher than the threshold temperature, the controller 14 reduces the duty cycle of the drive signal g*# for the target switching element S*#. This limitation of on duration of the switching element S*# reduces the total amount of a collector current Ice flowing through the target switching element S*#, thus suppressing the increase in the temperature of the switching element S*# and saving power to be supplied to the motor-generator 10.

In addition, the high-side controller 38 serves as the information outputting module 38d to perform a signal output task.

Specifically, the signal output task is designed to output, as a second Duty signal, a feedback signal indicative of a voltage at the first high-side terminal TH1, and an abnormality signal to the gate of the voltage-control switching element 20 and the controller 14 via the third photocoupler 62, the PWM controller 64, and the third low-side terminal TL3. The second Duty signal is a pulse signal having a duty cycle, i.e. a predetermined ratio or percentage of a logical high duration to the total logical high and low duration for each cycle. The voltage at the first high-side terminal TH1 represents an output voltage Vfb of the isolated switching power source PS. The abnormality signal represents information indicating that it has been determined that there is an abnormality in the switching element S*# by the overcurrent-protection task or the local shutdown task. Specifically, the third photocoupler 62 serves as a transferring module configured to transfer first information indicative of the output voltage Vfb of the isolated switching power source PS as an example of a value of the output power of the isolated switching power source PS from the high-side region to the low-side region while maintaining the electrical isolation between the high-side and low-side regions. The output power of the isolated switching power source PS in the first embodiment means a parameter indicative of electrical power output therefrom, such as a value of the voltage output from the power source PS, a value of the current output from the power source PS, or a value of electric power output from the power source PS whose unit is the joule per second.

Next, how the second Duty signal is output from the high-side controller 38 will be described hereinafter with reference to FIG. 3.

Figure 3:
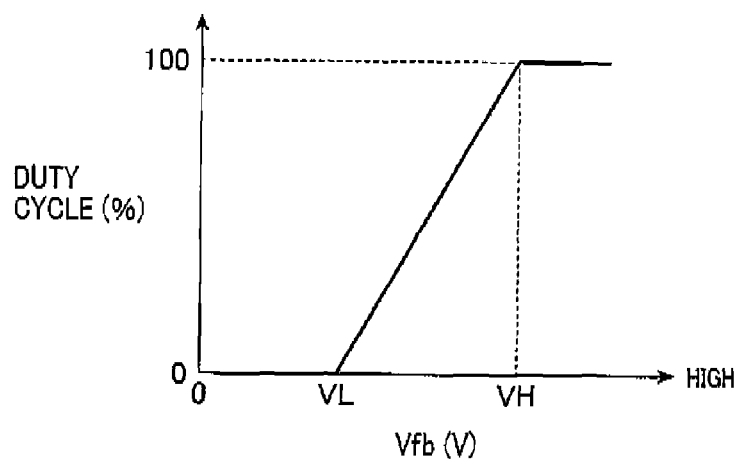
FIG. 3 is a graph schematically illustrating a relationship between a second Duty signal and an output voltage of the isolated switching power source illustrated in FIG. 2.

As illustrated in FIG. 3, in the first embodiment, a predetermined voltage range of the output voltage Vfb of the isolated switching power source PS is associated with a predetermined range of the duty cycle of the second Duty signal output from the high-side controller 38 by the signal output task thereof. For example, the predetermined voltage range of the output voltage Vfb is defined between a lower-limit voltage VL of for example, 11 V, and an upper-limit voltage VH of, for example, 18 V inclusive.

For example, the predetermined range of the duty cycle of the second Duty signal is defined between a lower limit of, for example, 0% and an upper limit of, for example, 100%.

In the first embodiment, the lower-limit voltage VL is associated with the lower limit 0% of the range of the duty cycle of the second Duty signal, and the upper-limit voltage VH is associated with the upper limit 100% of the range of the duty cycle of the second Duty signal. That is, in the first embodiment, the higher the output voltage Vfb of the isolated switching power source PS is, the higher the duty cycle of the second Duty signal is.

In the first embodiment, the lower-limit voltage VL is defined based on a minimum operating voltage of the drive IC 26, and the upper-limit voltage VH is defined based on an upper limit of the output voltage Vfb of the isolated switching power source PS. Until the output voltage Vfb reaches the upper-limit voltage VH, the isolated switching power source PS is capable of operating while maintaining its reliability. In the first embodiment, a target value for the output voltage Vfb is set to be higher than the lower-limit voltage VL and lower than the upper-limit voltage VH. For example, the target value for the output voltage Vfb is set to 17 V.

If it is determined that there is an abnormality in the switching element S*# by the overcurrent protection task or the local shutdown task, the high-side controller 38 serves as a duty signal outputting module 38e to set the duty cycle of the second Duty signal output therefrom by the signal output task thereof to 100%.

In order to transfer the second Duty signal from the high-side controller 38 to the controller 14 and the gate of the voltage-control switching element 20, the drive IC 26 is equipped with a set of the constant voltage source 58, the third photocoupler 62, the resistors 66 and 68, and the PWM controller 64.

Specifically, the third photocoupler 62 is comprised of a photodiode as its primary side and a phototransistor as its secondary side. The anode of the photodiode of the third photocoupler 62 is connected to the high-side controller 38, the cathode of the photodiode of the third photocoupler 62 is connected to one end of the resistor 66, and the other end of the resistor 66 is connected to the high-side common ground line. The collector of the phototransistor of the third photocoupler 62 is connected to the constant voltage source 58. The emitter of the phototransistor is connected to one end of the resistor 68, and the other end of the resistor 68 is connected to a low-side common ground line. The connection point between the emitter of the phototransistor and the one end of the resistor 68 is connected to the PWM controller 64.

Note that, as described above, digital photocouplers for transferring pulse signals are used as the respective first to third photocouplers 46, 54, and 62.

This configuration of the third photocoupler 62 and its peripherals 58, 66, and 68 makes it possible to convert the second Duty signal into the terminal voltage of the constant voltage source 58. That is, the configuration outputs the terminal voltage of the constant voltage source 58 as the logical high level of the second Duty signal. This configuration of the third photocoupler 62 and its peripherals 58, 66, and 68 also makes it possible to convert the logical low level of the second Duty signal into the low-side ground potential through the resistor 68. That is, the configuration outputs the low-side ground potential as the logical low level of the second Duty signal.

The PWM controller 64 is comprised of a signal converter 70, an inverting amplifier 72, a PWM comparator 74, and a carrier generator 76. These components 70, 72, 74, and 76 serve as an operating signal generating module and an operating signal.

To the signal converter 70, the connection point between the emitter of the phototransistor and the one end of the resistor 68 is connected. The signal converter 70 has, for example, map M representing a predetermined function between a variable of the duty cycle of the second Duty signal and a variable of an analog voltage signal Vo of the signal converter 70; the analog voltage signal Vo corresponds to the output voltage Vfb. Thus, the signal converter 70 is operative to output a value of the analog voltage signal Vo, which matches the duty cycle of the second Duty signal transferred through the third photocoupler 62. In the first embodiment, the map M represents, for example, a proportional function between a variable of the duty cycle of the second Duty signal and a variable of the analog voltage signal Vo of the signal converter 70. For this reason, the signal converter 70 increases a value of the analog voltage signal Vo as the duty cycle of the second Duty signal increases.

The inverting amplifier 72 is comprised of an operational amplifier 72a, a constant voltage source 72b, a first resistor 72c having a resistance R1, and a second resistor 72d having a resistance R2. The operational amplifier 72a has a non-inverting input terminal, an inverting input terminal, and an output terminal. The inverting input terminal of the operational amplifier 72a is connected to an output terminal of the signal converter 70 via the first resistor 72c, so that a value of the analog voltage signal Vo output from the signal converter 70 is input to the inverting input terminal of the operational amplifier 72a via the first resistor 72c. The inverting input terminal of the operational amplifier 72a is also connected to one end of the second resistor 72d. The non-inverting input terminal of the operational amplifier 72a is connected to a positive terminal of the constant voltage source 72b, and a negative terminal thereof is connected to for example, the low-side common ground line. The output terminal of the operational amplifier 72a is connected to a non-inverting input terminal of the PWM comparator 74 and to the other end of the second resistor 72d.

The configuration of the inverting amplifier 72 amplifies the difference between the value of the analog voltage signal Vo, i.e. the output voltage Vfb, and the constant voltage Va output from the constant voltage source 72b by a gain defined based on the resistances R1 and R2 of the first and second resistors 72c and 72d. The amplified difference between the output voltage Vfb and the constant voltage Va is output from the operational amplifier 72a to the non-inverting input terminal of the PWM comparator 74. For example, the constant voltage Va serves as a target voltage for the output voltage Vfb, so that the output signal from the operational amplifier 72a is determined based on the resistances R1 and R2 of the first and second resistors 72c and 72d and the constant voltage Va output from the constant voltage source 72b.

In addition to the non-inverting input terminal, the PWM comparator 74 has an inverting input terminal and an output terminal. To the inverting input terminal, an output terminal of the carrier generator 76 is connected. The output terminal of the PWM comparator 74 is connected to each of the controller 14 and the gate of the voltage-control switching element 20 via the third low-side terminal TL3.

The carrier generator 76 is operative to generate a cyclic triangular carrier signal, and output the cyclic triangular carrier signal to the inverting input terminal of the PWM comparator 74. Note that a cyclic saw-tooth carrier signal can be used in place of the cyclic triangular carrier signal.

The PWM comparator 74 is operative to perform a PWM task based on comparison in magnitude between: the output signal from the operational amplifier 72a, which is proportional to the difference between the value of output voltage Vfb and the target voltage; and the level of the cyclic triangular carrier signal. This generates a PWM signal as a drive signal for the voltage-control switching element 20. The PWM signal, i.e. the drive signal is a cyclic pulse signal having a controllable duty cycle (controllable on-pulse width for each cycle); the duty cycle is expressed as a predetermined ratio of on-pulse width to the total duration of each cycle.

Specifically, if neither the overcurrent protection task nor the local shutdown task is performed, the configuration of the PWM controller 64 inputs, to the gate of the voltage-control switching element 20, the PWM signal generated based on comparison in magnitude between the output signal from the inverting amplifier 72, which matches the output voltage Vfb of the inverting switching power source PS, and the carrier signal. This turns on or off the voltage-control switching element 20 to thereby match the output voltage Vfb of the inverting switching power source PS fed back from the inverting switching power source PS with the target voltage.

Otherwise, if the overcurrent task or the local shutdown task is performed, the PWM controller 64 is capable of outputting, to the controller, information representing that there is an abnormality in the switching element S*#.

Specifically, in the first embodiment, if the duty cycle of the PWM signal, output from the third low-side terminal TL3 is 100%, the controller 14 determines that there is:

an abnormality that an overcurrent flows through the switching element S*#, or an abnormality representing a high possibility of the switching element S*# becoming in an overheating condition.

These abnormalities will be simply referred to as an overcurrent abnormality and an overheat abnormality in the switching element S*# hereinafter.

This is based on the configuration that, when performing the overcurrent protection task or the local shutdown task, the high-side controller 38 sets the duty cycle of the second Duty signal, which is to be output therefrom, to 100%.

Specifically, while the duty cycle of the second Duty signal output from the high-side controller 38 is set to 100%, the level of the output signal applied to the non-inverting input terminal of the PWM comparator 74 from the inverting amplifier 72 is continuously higher than the level of the cyclic triangular carrier signal input to the inverting input terminal of the PWM comparator 74 from the carrier generator 76. This results in the duty cycle of the PWM signal output from the third low-side terminal TL3 becoming 100%.

While the duty cycle of the PWM signal output from the third low-side terminal TL3 is set to 100%, the voltage-control switching element 20 is continuously in an on state, causing a current to continuously flow through the close loop constructed by the low-voltage battery 16, the primary winding 18*a*, and the voltage-control switching element 20. In order to avoid such continuous current-flow, the drive unit DU is preferably provided with means for preventing formation of the closed loop. For example, as illustrated in FIG. 2 by a phantom line, an interrupt unit IU, such as a MOSFET or another switching element, can be provided on an electrical path between the third low-side switching element TL3 and the voltage-control switching element 20 as an example of such preventing means. The interrupt unit IU has a control terminal connected to the third low-side switching element TL3, and shuts off the electrical path between the third low-side switching element TL3 and the voltage-control switching element 20 if it is determined that the duty cycle of the PWM signal output from the third low-side terminal TL3 is set to 100%. This interrupts the power supply from the isolated switching power source PS to the drive unit IC 26 even if the duty cycle of the PWM signal output from the third low-side terminal TL3 is set to 100%.

In the first embodiment, if the high-side controller 38 determines that the output voltage Vfb of the isolated switching power source PS becomes the lower-limit voltage VL, the signal output task of the high-side controller 38 functions as the duty signal outputting module 38*e* to set the duty cycle of the second Duty signal to 0%. Specifically, while the duty cycle of the second Duty signal output from the high-side controller 38 is set to 0%, the level of the output signal applied to the non-inverting input terminal of the PWM comparator 74 from the inverting amplifier 72 is continuously lower than the level of the cyclic triangular carrier signal input to the inverting input terminal of the PWM comparator 74 from the carrier generator 76. This results in the duty cycle of the PWM signal output from the third low-side terminal TL3 becoming 0%. In the first embodiment, the controller 14 determines that there is an abnormality of the output voltage Vfb of the isolated switching power source PS excessively decreasing if the duty cycle of the PWM signal output from the third low-side terminal TL3 is 0%.

Figure 4A:
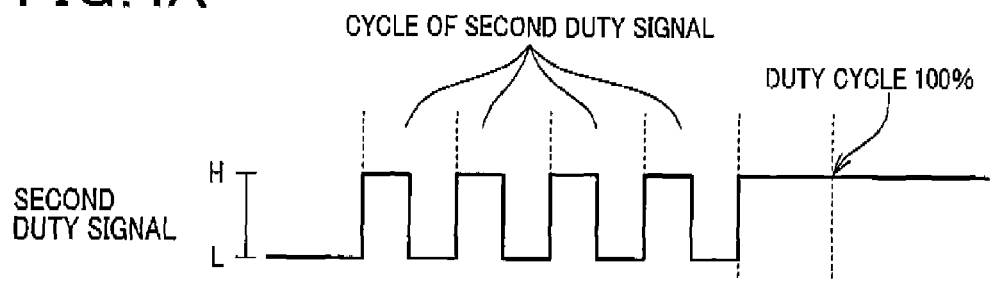
FIGS. 4A and 4B are a jointly timing chart schematically illustrating how the second Duty signal and a first flag vary if there is an overcurrent abnormality or an overheat abnormality in the switching element.
Figure 4B:
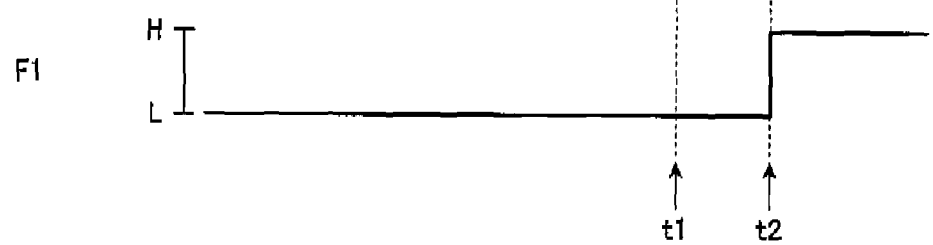

FIG. 4 schematically illustrates an example of the signal, output task carried out by the high-side controller 38 if there is an overcurrent abnormality or an overheat abnormality in the switching element S*#. Specifically, FIGS. 4A and 4B jointly illustrate a timing chart schematically illustrating how the second Duty signal output from the high-side controller 38 varies, and how a first abnormality flag F1 varies. Note that the first abnormality flag F1, which is a bit having a logical low value, represented by L, or a logical high value, represented by H, is stored beforehand in the controller 14. The first abnormality flag being set to the level H represents that there is an overcurrent abnormality or an overheat abnormality in the switching element S*#. On the other hand, the first abnormality flag being set to the level L represents that there are not overcurrent and overheat abnormalities for the switching element S*#.

Referring to FIGS. 4A and 4B, if the high-side controller 38 determines that there is an overcurrent abnormality or an overheat abnormality in the switching element S*#, the high-side controller 38 sets the duty cycle of the second Duty signal to 100% at time t1. Thus, the duty cycle of the PWM signal being sent to the controller 14 is set to 100% at the time t1. After lapse of one cycle of the PWM signal from the time t1, the controller 14 determines whether the duty cycle of the PWM signal being sent thereto is continuously set to 100% at time t2. Upon determination that the duty cycle of the PWM signal being sent thereto is continuously set to 100% at the time t2, the controller 14 determines that there is an overcurrent abnormality or an overheat abnormality in the switching element S*# at the time t2, then changing the first abnormality flag F1 from the level L to the level H.

Figure 5A:
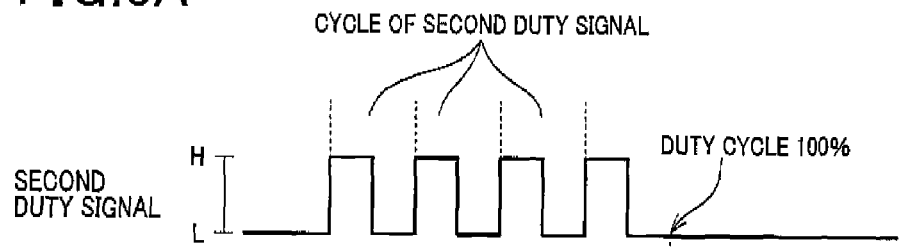
FIGS. 5A and 5B are a jointly timing chart schematically illustrating how the second Duty signal and a second abnormality flag vary if the output voltage of the isolated switching power source becomes a predetermined lower limit.
Figure 5B:
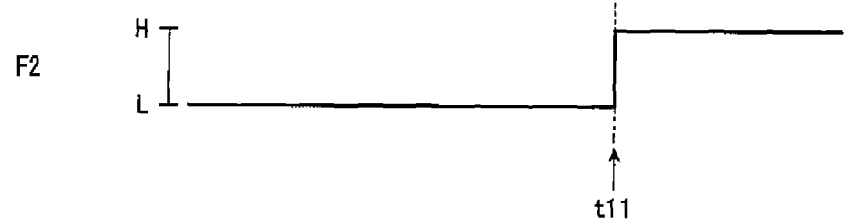

FIG. 5 schematically illustrates an example of the signal output task carried out by the high-side controller 38 if the output voltage Vfb of the isolated switching power source PS becomes the lower-limit voltage VL. Specifically, FIGS. 5A and 5B jointly illustrate a timing chart schematically illustrating how the second Duty signal output from the high-side controller 38 varies, and how a second abnormality flag F2 varies. Note that the second abnormality flag F2, which is a bit having a logical low value L or a logical high value H is stored beforehand in the controller 14. The second abnormality flag being set to the level H represents that there is an abnormality that the output voltage Vfb of the isolated switching power source PS excessively decreases. On the other hand, the second abnormality flag being set to the level L represents that there is not such an abnormality in the output voltage Vfb of the isolated switching power source PS.

Referring to FIGS. 5A and 5B, if the high-side controller 38 determines that there is an abnormality that the output voltage Vfb of the isolated switching power source PS excessively decreases, the high-side controller 38 sets the duty cycle of the second Duty signal to 0% at time t11 although the timing t11 is the start of one cycle of the PWM signal. Thus, because the duty cycle of the PWM signal being sent to the controller 14 is unchanged to 0% at the time t11, the controller 14 determines that there is an abnormality that the output voltage Vfb of the isolated switching power source PS excessively decreases, then changing the second abnormality flag F2 from the level L to the level H.

Figure 6:
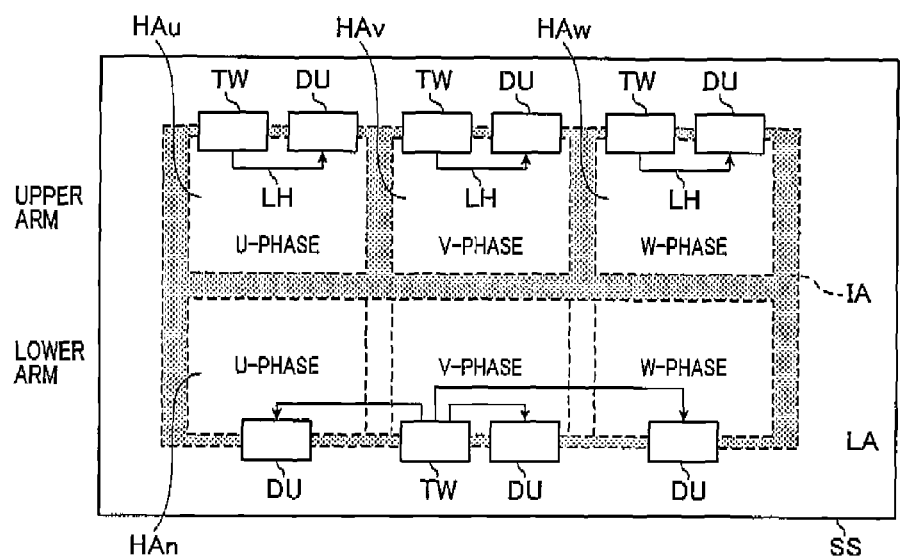
FIG. 6 is a view schematically illustrating how drive units and transformers of the isolated switching power source are mounted on a semiconductor substrate according to the first embodiment.

In the first embodiment, the drive ICs 26 of the inverter INV for the respective switching elements S*# and the transformers TW for the respective-phase high-side switching elements S*p and the V-phase low-side switching element Svn are so mounted collectively on a semiconductor substrate SS as to be integrated as illustrated in FIG. 6. Note that, in FIG. 6, each of the transformers TW includes the voltage-control switching element 20, the diode 22, and the capacitor 24.

Specifically, referring to FIG. 6, on one surface of the semiconductor substrate SS, a common low-side region LA, and four high-side regions HAu, HAv, HAw, and HAn are formed. In addition, an insulating layer IA is formed on the one surface of the semiconductor substrate SS between the high-side regions HAu, HAv, HAw, and HAn and the low-side region LA to electrically insulate the high-side regions HAu, HAv, HAw, and HAn from the low-side region LA.

The three high-side regions HAu, HAv, and HAw are formed for the drive ICs 26 for the respective-phase upper-arm switching elements S*p, and aligned on the one surface of the semiconductor substrate SS in this order. The high-voltage region HAn is formed for the drive IC 26 for the respective-phase lower-arm switching elements S*n, and located in parallel to the alignment direction of the three high-side regions HAu, HAv, and HAw. Note that, in the first embodiment, the emitters of the low-side switching elements S*n constituting the lower arm are commonly connected to each other, so that the high-side ground potentials of the drive ICs 26 for the lower-arm switching elements S*n are common to each other. For these reason, as described above, in the first embodiment, the common high-voltage region HAn is used for the lower-arm switching elements S*n.

On the high-side region HAu, components of the drive IC 26 for the U-phase upper-arm switching element Sup, which lie in the high-side region illustrated in FIG. 2, are mounted. Similarly, on the high-side region HAv, components of the drive IC 26 for the V-phase upper-arm switching element Svp, which lie in the high-side region illustrated in FIG. 2, are mounted. In addition, on the high-side region HAw, components of the drive IC 26 for the W-phase upper-arm switching element Swp, which lie in the high-side region illustrated in FIG. 2, are mounted. In contrast, on the low-side region LA, components of the drive IC 26 for each of the respective-phase upper-arm switching elements S*p, which lie in the low-side region illustrated in FIG. 2, are mounted.

On the high-side region HAn, components of the drive IC 26 for each of the respective-phase lower-arm switching elements S*n, which lie in the high-side region illustrated in FIG. 2, are mounted. In contrast, on the low-side region LA, components of the drive IC 26 for each of the respective-phase lower-arm switching elements S*n, which lie in the low-side region illustrated in FIG. 2, are mounted. For example, the components of the drive IC 26 in the high-side region for the V-phase lower-arm switching element Svn are located between the components of the drive IC 26 in the high-side region for the U-phase lower-arm switching element Sun and those of the drive IC 26 in the high-side region for the W-phase lower-arm switching element Swn. Similarly, the components of the drive IC 26 in the low-side region for the V-phase lower-arm switching element Svn are located between the components of the drive IC 26 in the low-side region for the U-phase lower-arm switching element Sun and those of the drive IC 26 in the low-side region for the W-phase lower-arm switching element Swn.

In addition, the secondary winding 18b, the diode 22, and the capacitor 24 of the transformer TW for the U-phase upper-arm switching element Sup, which lie in the high-side region illustrated in FIG. 2, are mounted on the high-side region HAu. Similarly, on the high-side region HAv, the secondary winding 18b, the diode 22, and the capacitor 24 of the transformer TW for the V-phase upper-arm switching element Svp, which lie in the high-side region illustrated in FIG. 2, are mounted. In addition, on the high-side region HAw, the secondary winding 18b, the diode 22, and the capacitor 24 of the transformer TW for the W-phase upper-arm switching element Swp, which lie in the high-side region illustrated in FIG. 2, are mounted. In contrast, on the low-side region LA, the primary winding 18a and the voltage-control switching element 20 of the transformer TW for each of the upper-arm switching elements S*p, which lie in the low-side region illustrated in FIG. 2, are mounted.

On the high-side region HAn, the secondary winding 18b, the diode 22, and the capacitor 24 of the transformer TW for each of the lower-arm switching element S*p, which lie in the high-side region illustrated in FIG. 2, are mounted. In contrast, on the low-side region LA, the primary winding 18a and the voltage-control switching element 20 of the transformer TW for each of the lower-arm switching elements S*n, which lie in the low-side region illustrated in FIG. 2, are mounted.

Note that, in FIG. 6, the drive ICs 26 of the inverter INV for the respective switching elements S*# are mounted on the semiconductor substrate SS, but the drive units DU of the inverter INV for the respective switching elements S*# can be mounted thereon.

The configuration of the inverter INV illustrated in FIG. 6 makes it possible for each drive unit DU to perform feedback control of the output voltage Vfb of the isolated switching power source PS independently for a corresponding one of the upper-arm switching elements S*p. This results in an increase of the accuracy of adjusting the output voltage Vfb supplied to the drive unit DU for each of the upper-arm switching elements S*p.

The configuration of the inverter INV illustrated in FIG. 6 results in reduction of the length of the electrical path LH between the secondary winding 18b, i.e. the diode 22, and the first high-side switching element TH1 in each of the high-side regions HAu, HAv, and HAw. This is because the secondary winding 18b, i.e. the diode 22, and the first high-side switching element TH1 for each of the switching elements S*p are formed on the corresponding same high-side region.

Specifically, as illustrated in FIG. 6, the insulating region IA need be formed between the high-side regions HAu, HAv, HAw, and HAn and the low-side region LA. For this reason, an increase in the electrical path LH might increase the insulating region IA, causing the area of the surface of the semiconductor substrate SS on which the drive ICs 26 can be mounted, to decrease. This might result in large restrictions of flexibility of the artwork design for the circuit pattern of each of the drive ICs 26.

As a comparative example, let us consider a configuration that a single transformer of an isolated switching power source supplies power, i.e. the output voltage Vfb, to the drive units DU for the respective-phase upper-arm switching elements S*p. This configuration of the comparative example may probably increase the length of the electrical path between the single transformer and each of the drive units DU for the respective-phase upper-arm switching elements S*p. This may increase the area of the insulating region IA on the semiconductor substrate SS.

In comparison to the length of the electrical path in the comparative example, the configuration of the inverter INV illustrated in FIG. 6 reduces the length of the electrical path LH between each of the drive units DU for the respective-phase upper-arm switching elements S*p and the secondary winding 18b, i.e. the diode 22, of a corresponding one of the transformers TW. This results in an increase of the area of the surface of the semiconductor substrate SS on which the drive ICs 26 can be mounted, thus improving the flexibility of the artwork design for the circuit pattern of each of the drive ICs 26.

Note that, as described above, the potentials at the emitters of the low-side switching elements S*n are set to the common low-side ground potential. For this reason, the isolated switching power source PS supplies power to the drive unit DU for each of the lower-arm switching elements S*n using the single transformer TW provided for the drive unit DU for the V-phase lower-arm switching element Svn. This configuration reduces the number of transformers in comparison to the configuration that the transformers TW are provided for the drive units DU for the respective-phase low-side switching elements S*n. In addition, let us consider the components of the drive IC 26 in the high-side region for the V-phase lower-arm switching element Svn are located between the components of the drive IC 26 in the high-side region for the U-phase lower-arm switching element Sun and those of the drive IC 26 in the high-side region for the W-phase lower-arm switching element Swn. Thus, this configuration results in reduction of the length of an electrical path, between the drive IC 26 for each of the lower-arm switching elements S*n and the voltage-control switching element 20 of the transformer TW; the electrical path is used to transfer the PWM signal from the drive IC 26 to the voltage-control switching element 20. This makes it possible to reduce, on the PWM signal, the negative impact of floating inductance in or near to the electrical path.

As described above, the drive IC 26 for each drive unit DU according to the first embodiment is integrated with the high-side controller 38 for turning on or off the switching element S*#, and the PWM controller 64 for performing feedback control of the output voltage Vfb to the target value. This configuration makes it possible to reduce the size of each drive unit DU in comparison to a corresponding drive unit configured such that the PWM controller 64 is located out of the drive IC 26.

The drive unit DU for each of the switching element S*# is also configured to share the third photocoupler 62 for transferring, from the high-side region to the low-side region, both:

abnormality information representing that there is an abnormality associated with the corresponding switching element S*#, such as an overcurrent abnormality or an overheat abnormality; and feedback-control information representing the PWM signal, i.e. the drive signal, for feedback control of the output power of the isolated switching power source PS.

This configuration makes it possible to eliminate an addition of a photocoupler designed specifically for transferring the PWM signal for feedback control of the output power of the isolated switching power source PS. This results in reduction of an increase of the circuit size of the drive IC 26, i.e. the drive unit DU, and therefore, results in reduction of the manufacturing cost of the drive IC 26, i.e. the drive unit DU.

The frequency of transfer of the abnormality information from the drive unit DU is usually low. For this reason, the configuration of the drive unit DU that transfers the abnormality information and the feedback-control information from the high-side region to the low-side region via the common third photocoupler 62 increases the frequency of transfer of the feedback-control information to the PWM controller 64. This results in an increase of the accuracy of adjusting the output voltage Vfb from the isolated switching power source PS based on the voltage feedback control.

The drive unit DU for each of the switching element S*# according to the first embodiment is configured to:

set the duty cycle of the second Duty signal output from the high-side controller 38 to its upper limit of, for example, 100% if it is determined that there is an abnormality associated with the corresponding switching element S*#; and set the duty cycle of the second Duty signal output from the high-side controller 38 to its lower limit of, for example, 0% if it is determined that there is an abnormality of the output voltage Vfb becoming the lower-limit voltage VL.

This configuration permits the controller 14 to determine whether these different abnormalities occur for each of the switching elements S*#.

If the output voltage Vfb becomes the lower-limit voltage VL, the duty cycle of the second Duty signal output from the high-side controller 38 is set to 0%, which causes the duty cycle of the PWM signal supplied to the voltage-control switching element 20 to be automatically turned off. This results in automatic shutoff of power supply from the isolated switching power source PS to the drive IC 26. That is, the configuration of the drive unit DU for each of the switching element S*# according to the first embodiment is inherently equipped with a circuit, i.e. a UVLO (Under Voltage Lock Out) circuit, for preventing abnormal operations of the isolated switching power source PS if the output voltage Vfb becomes equal to or lower than the lower-limit voltage VL. Thus, it is possible to eliminate an addition of such a UVLO circuit to the drive IC 26, thus further reducing the size and manufacturing cost of the drive IC 26, i.e. the drive unit DU.

In the first embodiment, execution of the overcurrent protection task or the local shutdown task disables drive of the switching element S*#. However, although the drive of the switching element S*# is disabled, there might be a risk that any cause, such as entry of noise into the gate of the switching element S*# or the like, might erroneously drive the switching element S*#.

In order to address such a risk, the drive unit DU for each of the switching element S*# according to the first embodiment can be equipped with means for preventing formation of the closed loop constructed by the low-voltage battery 16, the primary winding 18a, and the voltage-control switching element 20 while the duty cycle of the PWM signal output from the third low-side terminal TL3 is set to 100% or 0%. This preventing means, such as the interrupt unit IU, shuts off the electrical path between the third low-side switching element TL3 and the voltage-control switching element 20 if it is determined that the duty cycle of the PWM signal output from the third low-side terminal TL3 is set to 100% or 0%. This interrupts the power supply from the isolated switching power source PS to the drive unit IC 26 to thereby interrupt power supply from the isolated switching power source PS to the drive IC 26. This makes it possible to reliably prevent the switching element S*3 from erroneously operating.

Second Embodiment

A control system for controlling the motor-generator 10 according to a second embodiment of the present disclosure will be described with reference to FIGS. 7 to 9.

The structure and/or functions of the control system according to the second embodiment are mainly identical to those of the control system according to the first embodiment except for the following points. So, the different points will be mainly described hereinafter.

Figure 7:
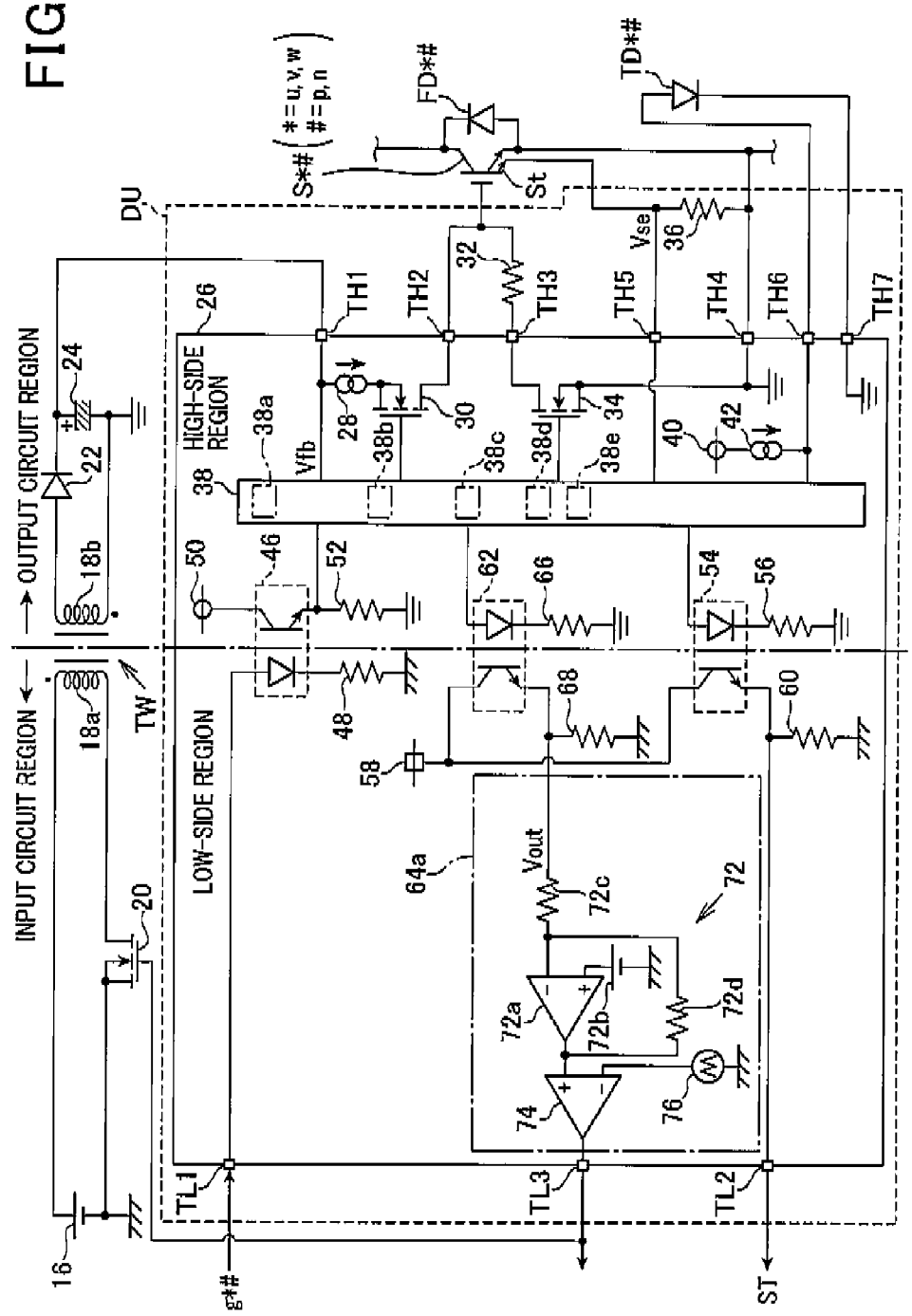
FIG. 7 is a circuit diagram schematically illustrating an example of the structures of a drive unit for a switching element and an isolated switching power source of a control system according to a second embodiment of the present disclosure.

FIG. 7 schematically illustrates an example of the isolated switching power source PS and that of each drive unit DU provided for a corresponding one switching element S*#.

Referring to FIG. 7, a drive IC 26a of the drive unit DU is provided with no signal converters 70. For this reason, the connection point between the emitter of the phototransistor of the third photocoupler 62 and the one end of the resistor 68 is connected to the inverting amplifier 72, i.e. the inverting input terminal of the operational amplifier 72a via the first resistor 72c. In the second embodiment, as the third photocoupler 62, an analog photocoupler for transferring analog signals, i.e. continuous signals, is used.

Next, how the voltage signal Vout is output from the high-side controller 38 will be described hereinafter with reference to FIG. 8.

Figure 8:
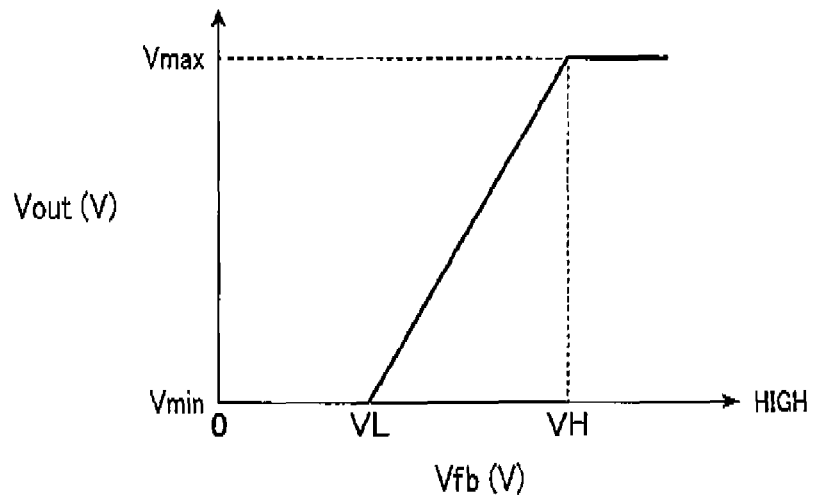
FIG. 8 is a graph schematically illustrating a relationship between a voltage signal output from a high-side controller illustrated in FIG. 7 and the output voltage of the isolated switching power source illustrated in FIG. 7.

As illustrated in FIG. 8, in the second embodiment, a predetermined voltage range of the output voltage Vfb of the isolated switching power source PS is associated with a predetermined range of a voltage signal Vout output from the high-side controller 38 by the signal output task thereof.

For example, the predetermined range of the voltage signal Vout to be input to the inverting amplifier 72 is defined between a lower limit Vmin of, for example, 0 V and an upper limit Vmax of, for example, 5 V.

In the second embodiment, the lower-limit voltage VL is associated with the lower limit Vmin of the predetermined range of the voltage signal Vout, and the upper-limit voltage VH is associated with the upper limit Vmax of the predetermined range of the voltage signal Vout. That is in the first embodiment, the higher the output voltage Vfb of the isolated switching power source PS is, the higher the voltage signal Vout to be input to the inverting amplifier 72 is.

If it is determined that there is an overcurrent abnormality or overheat abnormality in the switching element S*# by the overcurrent protection task or the local shutdown task, the voltage signal Vout output from the high-side controller 38 to the inverting amplifier 72 via the third photocoupler 62 by the signal output task thereof is set to the upper limit Vmax.

Otherwise, if it is determined that the output voltage Vfb of the isolated switching power source PS becomes the lower-limit voltage VL, the voltage signal Vout output from the high-side controller 38 to the inverting amplifier 72 via the third photocoupler 62 by the signal output task thereof is set to the lower limit Vmin.

How to output the output voltage Vfb of the isolated switching power source PS within the range from the lower limit Vmin to the upper limit Vmax through the third photocoupler 62 will be described with, reference to FIG. 9 as an example.

Figure 9:
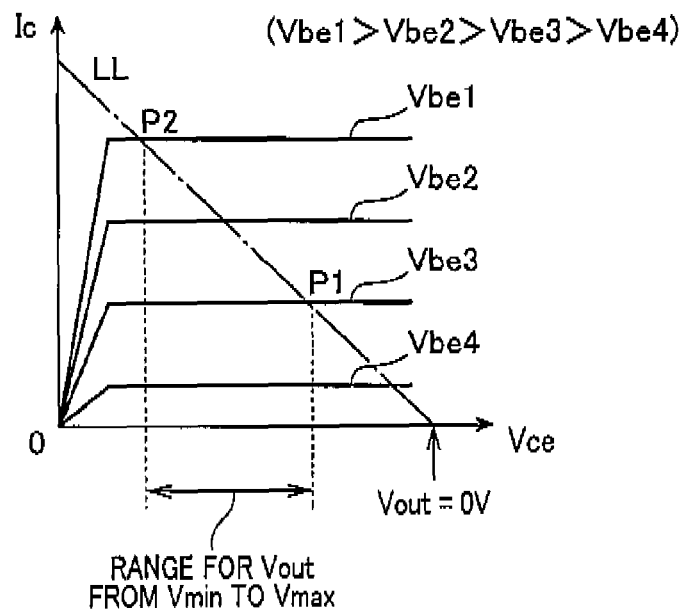
FIG. 9 is a graph schematically illustrating predetermined characteristic curves of a phototransistor of a third photocoupler illustrated in FIG. 7.

For example, as illustrated in FIG. 9, the phototransistor of the third photocoupler 62 has predetermined Ic-Vce characteristic curves representing the relationship between collector current Ic through the phototransistor and collector-emitter voltage Vce thereacross. The Ic-Vce characteristic curves depend on values Vbe1, Vbe2, Vbe3, Vbe4 of the base-emitter voltage Vbe of the phototransistor, and the base-emitter voltage Vbe depends on the level of current flowing through the photodiode of the third photocoupler 62. A load line LL defined based on the terminal voltage of the constant voltage source 58 and the resistance of the resistor 60 is illustrated on the Ic-Vce characteristic curves. In the second embodiment, a value of the collector-emitter voltage Vce at a point P1 of intersection of the load line LL and the Ic-Vce characteristic curve based on the value Vbe3 of the base-emitter voltage Vbe is set to the lower limit Vmin. In addition, a value of the collector-emitter voltage Vce at a point P2 of intersection of the load line LL and the Ic-Vce characteristic curve based on the value Vbe1 of the base-emitter voltage Vbe is set to the upper limit Vmax.

Thus, if the output voltage Vfb is the lower-limit voltage VL, the high-side controller 38 adjusts the level of current flowing through the photodiode of the third photocoupler 62 to adjust a value of the base-emitter voltage Vbe to the value Vbe3. This sets a value of the voltage signal Vout output from the third photocoupler 62 to the lower limit Vmin. If the output voltage Vfb is the upper-limit voltage VH, the high-side controller 38 adjusts the level of current flowing through the photodiode of the third photocoupler 62 to adjust a value of the base-emitter voltage Vbe to the value Vbe1. This sets a value of the voltage signal Vout output from the third photocoupler 62 to the upper limit Vmax.

Thus, adjusting the level of current flowing through the photodiode of the third photocoupler 62 makes it possible to change a value of the voltage signal Vout output from the third photocoupler 62 to be input to the inverting amplifier 72 within the range from the lower limit Vmin to the upper limit Vmax inclusive.

The operations of the inverting amplifier 72 and the PWM comparator 74 according to the second embodiment are substantially identical to those of the inverting amplifier 72 and the PWM comparator 74 according to the first embodiment as long as:

the second Duty signal or the duty cycle of the second Duty signal should be read as the voltage signal Vout;

100% of the duty cycle of the second Duty signal should be read as the upper limit Vmax of the voltage signal Vout; and 0% of the duty cycle of the second Duty signal should be read as the lower limit Vmin of the voltage signal Vout.

If neither the overcurrent protection task nor the local shutdown task is performed, the configuration of the PWM controller 64 inputs, to the gate of the voltage-control switching element 20, the PWM signal generated based on comparison in magnitude between the output signal from the inverting amplifier 72, which matches the output voltage Vfb of the inverting switching power source PS, and the carrier signal. This turns on or off the voltage-control switching element 20 to thereby match the output voltage Vfb of the inverting switching power source PS fed back from the inverting switching power source PS with the target voltage.

Otherwise, if the overcurrent task or the local shutdown task is performed, the PWM controller 64 is capable of outputting, to the controller, information representing that there is an abnormality in the switching element S*#.

Specifically, in the second embodiment, if the duty cycle of the PWM signal output from the third low-side terminal TL3 is 100%, the controller 14 determines that there is an overcurrent abnormality or an overheat abnormality in the switching element S*#.

Specifically, while the voltage signal Vout output from the high-side controller 38 is set to the upper limit Vmax, the level of the output signal applied to the non-inverting input terminal of the PWM comparator 74 from the inverting amplifier 72 is continuously higher than the level of the cyclic triangular carrier signal input to the inverting input terminal of the PWM comparator 74 from the carrier generator 76. This results in the duty cycle of the PWM signal output from the third low-side terminal TL3 becoming 100%.

In the second embodiment, if the high-side controller 38 determines that the output voltage Vfb of the isolated switching power source PS becomes the lower-limit voltage VL, the signal output task of the high-side controller 38 sets the voltage signal Vout to the lower limit Vmin. Specifically, while the voltage signal Vout output from the high-side controller 38 is set to the lower-limit voltage VL, the level of the output signal applied to the non-inverting input terminal of the PWM comparator 74 from the inverting amplifier 72 is continuously lower than the level of the cyclic triangular carrier signal input to the inverting input terminal of the PWM comparator 74 from the carrier generator 76. This results in the duty cycle of the PWM signal output from the third low-side terminal TL3 becoming 0%. In the second embodiment, the controller 14 determines that there is an abnormality of the output voltage Vfb of the isolated switching power source PS excessively decreasing if the duty cycle of the PWM signal output from the third low-side terminal TL3 is 0%.

The configuration of each drive unit DU according to the second embodiment also achieves the same effects as those achieved in the first embodiment.

Each of the first and second embodiments of the present disclosure can be modified as described hereinafter.

In the first embodiment, the second photocouplers 62 are provided for the six drive units DU for the respective switching elements S*#; these second photocouplers 62 are operative to transfer the temperature signals, i.e. the first Duty signals, ST to the controller 14, but the present invention is not limited thereto. Specifically, the second photocoupler 62 can be provided for a selected one of the six drive units DU; the temperature of one switching element S*# corresponding to the selected one of the six drive units DU is estimated to rise up to the most value in all the switching elements S*#. This configuration reduces the number of components constituting the selected one drive unit DU.

In each of the first and second embodiments, the high-side controller 38 transfers the second Duty signal or the voltage signal Vout to the PWM controller 64 via the third photocoupler 62, but the present disclosure is not limited thereto. Specifically, the high-side controller 38 of each drive unit DU can transfer the second Duty signal or the voltage signal Vout to the PWM controller 64 via the second photocoupler 54, which transfers the temperature signal, i.e. the first Duty signal, ST to the controller 14. For example, in this modification, the high-side controller 38 can multiplex the first Duty signal (temperature signal) ST and the second Duty signal or the voltage signal Vout into a multiplexed signal. This configuration reduces the number of components constituting each drive unit DU.

In each of the first and second embodiments, the high-side controller 38 transfers the abnormality information and the feedback-control information to the PWM controller 64 via the common third photocoupler 62, but the present invention is not limited thereto. Specifically, the drive IC 26 of at least one drive unit DU can be provided with:

the third photocoupler 62 and its peripherals 58, 66, and 68 for transferring the feedback-control information to the PWM controller 64 therethrough; and a photocoupler unit 62A including a photocoupler and its peripherals, which are identical to the third photocoupler 62 and its peripherals 58, 66, and 68, for transferring the abnormality information to the PWM controller 64 therethrough.

In this modification, the drive IC 26 of the at least one drive unit DU according to this modification is integrated with the high-side controller 38 for turning on or off the switching element S*#, and the PWM controller 64 for performing feedback control of the output voltage Vfb to the target value. This results in reduction of the size of the at least one drive unit DU according to this modification.

In each of the first and second embodiments, the PWM controller 64, which serves as an operating module for performing on/off operations of the voltage-control switching element 20, can be configured to perform feedback control of an output current from the isolated switching power source PS to a target value.

In a modification of the first embodiment, the PWM controller 64 can be located in the high-side region between the high-side controller 38 and the third photocoupler 62.

Figure 10:
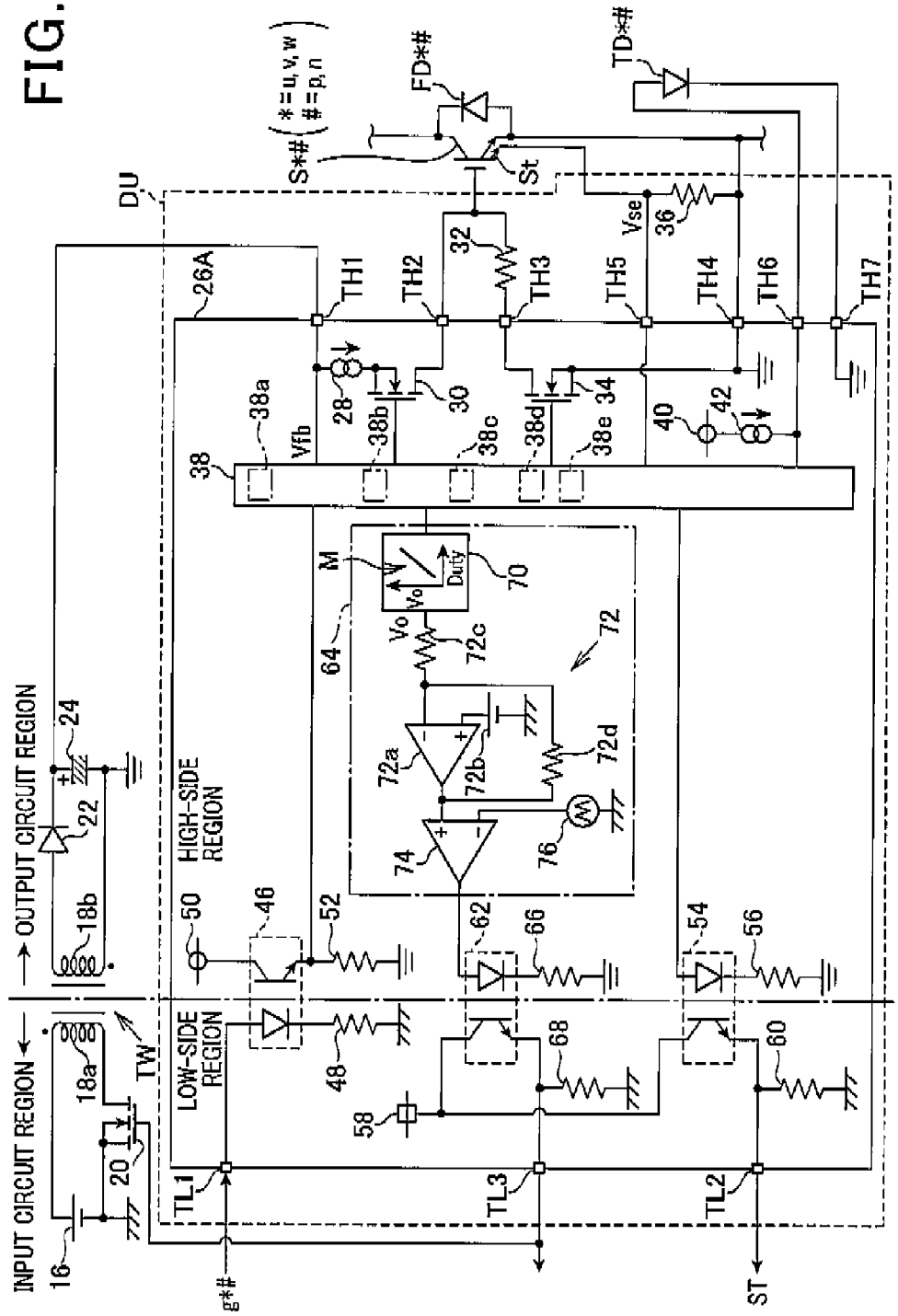
FIG. 10 is a circuit diagram schematically illustrating an example of the structures of a drive unit and an isolated switching power source of a control system according to a modification of the first embodiment of the present disclosure.

FIG. 10 schematically illustrates a drive IC 26A of at least one drive unit DU according to this modification. As illustrated in FIG. 10, the PWM controller 64 is located between the high-side controller 38 and the third photocoupler 62. Specifically, the signal converter 70 is connected to the high-side controller 38, and the anode of the photodiode of the third photocoupler 62 is connected to the output terminal of the PWM comparator 74.

In this modification, the second Duty signal output from the high-side controller 38 is input to the signal converter 70, and the signal converter 70 output a value of the analog voltage signal Vo, which matches the duty cycle of the second Duty signal transferred through the third photocoupler 62. The inverting amplifier 72 amplifies the difference between the value of the analog voltage signal Vo, i.e. the output voltage Vfb, and the constant voltage Va output from the constant voltage source 72b by the gain defined based on the resistances R1 and R2 of the first and second resistors 72c and 72d. The PWM comparator 74 performs the PWM task based on comparison in magnitude between: the output signal from the operational amplifier 72a, which is proportional to the difference between the value of output voltage Vfb and the target voltage; and the level of the cyclic triangular carrier signal. This generates a PWM signal as a drive signal, for the voltage-control switching element 20.

The PWM signal is input to the third photocoupler 62. The third photocoupler 62 transfers the PWM signal to the gate of the voltage-control switching element 20 and the controller 14 via the third low-side terminal TL3. In this modification, the drive IC 26A of the at least one drive unit DU is integrated with the high-side controller 38 for turning on or off the switching element S*#, and the PWM controller 64 for performing feedback control of the output voltage Vfb to the target value. This results in reduction of the size of the at least one drive unit DU according to this modification.

In each of the first and second embodiments, the drive unit DU for each of the switching element S*# can be configured to transfer, as the abnormality information, information representing that there is an abnormality in the circuits of the drive IC 26 used by the overcurrent protection task or the local shutdown task.

In the second embodiment, the high-side controller 38 serves as a voltage signal outputting module for outputting the voltage signal Vout to the PWM controller 64 via the third photocoupler 62, but the present disclosure is not limited thereto.

Figure 11:
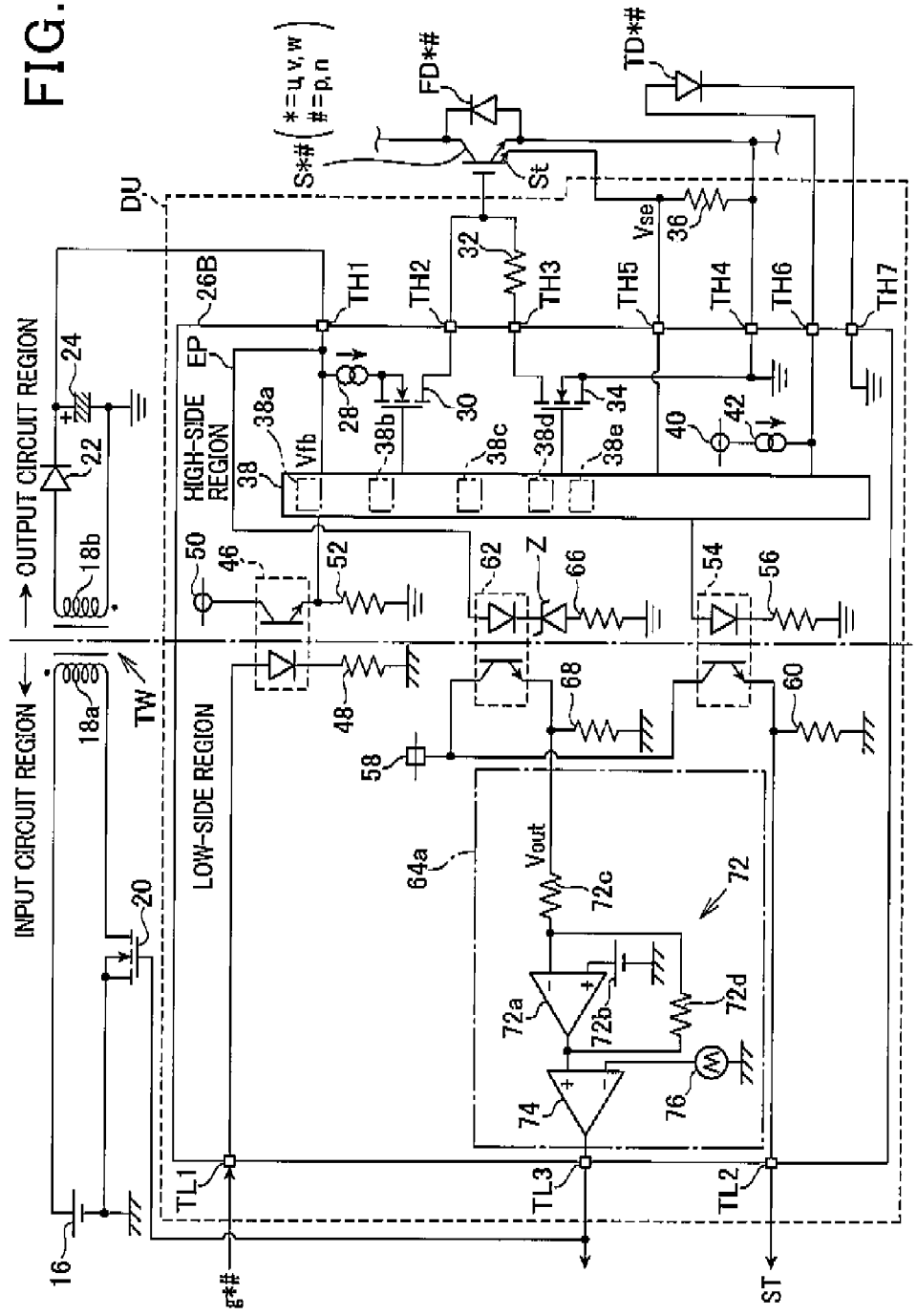
FIG. 11 is a circuit diagram schematically illustrating an example of the structures of a drive unit and an isolated switching power source of a control system according to a modification of the second embodiment of the present disclosure.

Specifically, as illustrated in FIG. 11, a drive IC 26B is comprised of an electrical path EP connected between the first high-side terminal TH1 and the anode of the photodiode of the photocoupler 62. The electrical path EP serves as a voltage signal outputting module for outputting the voltage signal Vout to the PWM controller 64 via the third photocoupler 62. In this modification, a Zener diode Z is interposed between the photodiode of the third photocoupler 62 and the resistor 66 such that the cathode of the Zener diode Z is connected to the resistor 66 and the anode thereof is connected to the photodiode of the third photocoupler 62. The Zener diode Z has a breakdown voltage being set to the lower-limit voltage VL.

This configuration permits a current to flow through the photodiode of the third photocoupler 62 and the Zener diode Z as long as the output voltage Vfb of the isolated switching power source PS is equal to or higher than the lower-limit voltage VL.

In the first embodiment, the lower-limit voltage VL is correlated with the lower limit of 0% of the duty cycle of the second Duty signal, and the upper-limit voltage VH is correlated with the upper limit of 100% of the duty cycle of the second Duty signal. However, the present disclosure is not limited to the correlations. Specifically, the lower-limit voltage VL can be correlated with the upper limit of 100% of the duty cycle of the second Duty signal, and the upper-limit voltage VH can be correlated with the lower limit of 0% of the duty cycle of the second Duty signal. This modification makes it possible for the controller 14 to determine whether there are different abnormalities for each of the switching element S*#.

Similarly, in the second embodiment, the lower-limit voltage VL can be correlated with the upper limit Vmax of the voltage signal Vout, and the upper-limit voltage VH can be correlated with the lower limit Vmin of the voltage signal Vout.

In the first embodiment, if it is determined that there is an abnormality associated with the switching element S*#, the high-side controller 38 can be configured to set the duty cycle of the second Duty signal to a value different from 0% or 100%. Specifically, if it is determined that there is an abnormality associated with the switching element S*#, the high-side controller 38 can be configured to preferably set the duty cycle of the second Duty signal to a value that is not normally used for the feedback control of the output voltage Vfb of the isolated switching power source PS.

As each of the switching elements S*#, a single IGBT is used, but a plurality of IGBTs parallelly connected to each other can be used as each of the switching elements S*#.

In each of the first and second embodiments, the voltage-control switching element 20 is located out of the drive IC 26, but can be located in the drive IC 26 if heat generated by the drive of the voltage-control switching element 20 has little effect on the components of the drive IC 26.

In each of the first and second embodiments, the low-side region and the high-side region, which are electrically insulated from each other, are used respectively as a first circuit region and a second circuit region, but the present disclosure is not limited thereto. Specifically, the high-side region and the low-side region can be used respectively as the first circuit region and the second circuit region if power output from a power source located in the high-side region need be supplied to the low-side region.

In each of the first and second embodiments, the first to third photocouplers 46, 54, and 62 are used as a transfer module for transferring information from the high-side region to the low-side region while electrically insulating between the high- and low-side regions, but the present invention is not limited thereto. Specifically, as each of the first to third photocouplers 46, 54, and 62, a magnetic coupler having a magnetoresistive element can be used. The magnetic coupler can be configured to:

measure the change in current flowing in an electrical path in the high-side region as change in an induction magnetic field using the magnetoresistive element without contacting the high-side region; and transfer information indicative of the measured change in the induction magnetic field to the low-side region.

In addition, as each of the first to third photocouplers 46, 54, and 62, a capacitance coupler having a coupling capacitor can be used. The capacitance coupler can be configured to receive the change in current flowing in an electrical path in the high-side region, and transfer information indicative of the received change in current using the coupling capacitor.

In each of the first and second embodiments, a flyback switching power source is used as an example of isolated switching power sources but another type of isolated switching power sources, such as a forward switching power source can be used as an example of these isolated switching power sources.

While the illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An electronic circuit operating based on an isolated switching power source that partitions a circuit region thereof into an input circuit region in which a power source lies and an output circuit region, the input circuit region being electrically isolated from the output circuit region; and outputs, via a switching element, power supplied from the power source to the output circuit region, the electronic circuit comprising:

a first circuit region electrically connected to the input circuit region;

a second circuit region electrically connected to the output circuit region; and an integrated circuit comprising:

a driver located in the second circuit region and configured to drive a target device based on the output power supplied to the second circuit region via the output circuit region;

a transferring module configured to transfer first information including a value of a parameter indicative of the output power from the second circuit region to the first circuit region while maintaining electrical isolation between the first and second circuit regions;

an operating module configured to perform, based on the first information transferred by the transforming module, on-off operations of the switching element to perform feedback control of the value of the parameter indicative of the output power supplied to the second circuit region via the output circuit region to a target value;

an abnormality determining module located in the second circuit region and configured to determine whether there is an abnormality associated with the target device; and an information outputting module configured to, if it is determined that there is an abnormality associated with the target device, output, to the transferrin module, abnormality information as the second information, the abnormality information representing that there is an abnormality associated with the target device;

the operating module comprises:
  an operating signal generating module located in the first circuit region and configured to output, based on the first information transferred from the transferring module, an operating signal that causes on/off operations of the switching element for the feedback control; and
  an operating signal outputting module located in the first circuit region and configured to output the operating signal generated by the operating signal generating module to the switching element,
the electronic circuit further comprising:
a duty signal outputting module configured to convert the value of the parameter indicative of the output power into a cyclic duty signal, and to output the duty signal to the transferring module, the cyclic duty signal having a duty cycle representing a ratio of on duration for the switching element to a total duration for each cycle, the duty cycle having a predetermined duty range defined between a lower limit and an upper limit inclusive,
the transferring module being configured to transfer the cyclic duty signal to the operating signal generating module as the first information,
the isolated switching power source having a predetermined voltage range of the output power defined between a lower limit voltage and an upper limit voltage inclusive,
the predetermined voltage range of the output power being associated with the predetermined duty range of the duty signal,
the duty cycle of the duty signal output from the duty signal outputting module being set to a value within a first part of the predetermined duty range of the duty signal,
the information outputting module being configured to, if it is determined that there is an abnormality associated with the target device, output, to the transferring module, the duty signal as the abnormality information, the duty cycle of the duty signal output from the information outputting module being set to a value within a second part of the predetermined duty range of the duty signal, the second part of the predetermined duty range being non-overlapping with the first part of the predetermined duty range.

2. The electronic circuit according to claim 1, wherein the integrated circuit further comprises an information outputting module located in the second circuit region and configured to output second information, different from the first information including the value of the parameter indicative of the output power, to the transferring module;
  the transferring module is configured to transfer both the first information and second information to the first circuit region.

3. The electronic circuit according to claim 1, wherein, as the duty cycle, the ratio of on duration for the switching element to the total duration for each cycle is expressed as a percentage, the lower limit of the predetermined duty range is set to 0%, the upper limit of the predetermined duty range is set to 100%, and the second part of the predetermined duty range is set to one of the lower limit and the upper limit of the predetermined duty range.

4. An electronic circuit operating based on an isolated switching power source that partitions a circuit region thereof into an input circuit region in which a power source lies and an output circuit region, the input circuit region being electrically isolated from the output circuit region; and outputs, via a switching element, power supplied from the power source to the output circuit region, the electronic circuit comprising:

a first circuit region electrically connected to the input circuit region;
a second circuit region electrically connected to the output circuit region; and
an integrated circuit comprising:
  a driver located in the second circuit region and configured to drive a target device based on the output power supplied to the second circuit region via the output circuit region;
  a transferring module configured to transfer first information including a value of a parameter indicative of the output power from the second circuit region to the first circuit region while maintaining electrical isolation between the first and second circuit regions;
  an operating module configured to perform, based on the first information transferred by the transforming module, on-off operations of the switching element to perform feedback control of the value of the parameter indicative of the output power supplied to the second circuit region via the output circuit region to a target value;
  an abnormality determining module located in the second circuit region and configured to determine whether there is an abnormality associated with the target device; and
  an information outputting module configured to, if it is determined that there is an abnormality associated with the target device, output, to the transferring module, abnormality information as the second information, the abnormality information representing that there is an abnormality associated with the target device,
  the operating module comprises:
    an operating signal generating module located in the first circuit region and configured to output, based on the first information transferred from the transferring module, an operating signal that causes on/off operations of the switching element for the feedback control; and
    an operating signal outputting module located in the first circuit region and configured to output the operating signal generated by the operating signal generating module to the switching element,
the electronic circuit further comprising:
a voltage signal outputting module configured to convert the value of the parameter indicative of the output power into an analog voltage signal, and to output the analog voltage signal to the transferring module, the analog voltage signal having a predetermined first voltage range defined between a lower limit and an upper limit voltage inclusive,
the transferring module being configured to transfer the analog voltage signal to the operating signal generating module as the first information,
the isolated switching power source having a predetermined second voltage range of the output power defined between a lower limit voltage and an upper limit voltage inclusive,
the second voltage range of the output power being associated with the first voltage range of the analog voltage signal,
the analog voltage signal output from the voltage signal outputting module being set to a value within a first part of the first voltage range of the duty signal,
the information outputting module being configured to, if it is determined that there is an abnormality associated with the target device, output, to the transferring module, the analog voltage signal as the abnormality information, the analog voltage signal output from the information outputting module being set to a value within a second part of the first voltage range of the analog voltage signal, the second part of the first voltage range being non-overlapping with the first part of the first voltage range.

5. The electronic circuit according to claim 4, wherein the lower limit of the first voltage range is set to 0 V, the upper limit of the first voltage range is set to a value higher than the lower limit, and the second part of the first voltage range is set to one of the lower limit and the upper limit of the first voltage range.

6. The electronic circuit according to claim 1, wherein the driver comprises a disabling module configured to disable drive of the target device if it is determined that there is an abnormality by the abnormality determining module, the operating module being configured to perform the off operation of the switching element to stop supply of the output power to the output circuit region if it is determined that there is an abnormality by the abnormality determining module.

7. The electronic circuit according to claim 1, wherein the target device is a target switching element.

8. The electronic circuit according to claim 7, wherein:
the target switching element consists of: a first pair of high- and low-side switching elements connected in series to each other; and a second pair of high- and low-side switching elements connected in series to each other,
the first pair of high- and low-side switching elements and the second pair of high- and low-side switching elements are connected in parallel to a DC power source,
the transferring module comprises first and second transformers, and is configured to output, via the switching element and the first and second transformers, the power supplied from the power source to the second circuit region via the output circuit region,
the integrated circuit consists of first and second integrated circuits,
the first and second transformers are provided for the respective high-side switching elements of the first and second pairs, and
the first and second integrated circuits are provided for the respective high-side switching elements of the first and second pairs.

9. The electronic circuit according to claim 4, wherein the transferring module further comprises a photocoupler communicably connecting the first and second circuit regions while maintaining electrical isolation between the first and second circuit regions.

10. The electronic circuit according to claim 4, wherein the integrated circuit further comprises an information outputting module located in the second circuit region and configured to output second information, different from the first information including the value of the parameter indicative of the output power, to the transferring module;
the transferring module is configured to transfer both the first information and second information to the first circuit region.

11. The electronic circuit according to claim 4, wherein the driver comprises a disabling module configured to disable drive of the target device if it is determined that there is an abnormality by the abnormality determining module,
the operating module being configured to perform the off operation of the switching element to stop supply of the output power to the output circuit region if it is determined that there is an abnormality by the abnormality determining module.

12. The electronic circuit according to claim 4, wherein the target device is a target switching element.

* * * * *